US011855191B2

United States Patent
Anderson et al.

(10) Patent No.: US 11,855,191 B2
(45) Date of Patent: Dec. 26, 2023

(54) VERTICAL FET WITH CONTACT TO GATE ABOVE ACTIVE FIN

(71) Applicant: International Business Machines Corporation, Armonk, NY (US)

(72) Inventors: Brent Anderson, Jericho, VT (US); Junli Wang, Slingerlands, NY (US); Indira Seshadri, Niskayuna, NY (US); Chen Zhang, Guilderland, NY (US); Ruilong Xie, Niskayuna, NY (US); Joshua M. Rubin, Albany, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 17/450,121

(22) Filed: Oct. 6, 2021

(65) Prior Publication Data

US 2023/0104456 A1    Apr. 6, 2023

(51) Int. Cl.
*H01L 29/66* (2006.01)
*H01L 29/78* (2006.01)
*H01L 21/8234* (2006.01)
*H01L 21/8238* (2006.01)
*H01L 27/092* (2006.01)

(52) U.S. Cl.
CPC .......... *H01L 29/66803* (2013.01); *H01L 21/823431* (2013.01); *H01L 21/823821* (2013.01); *H01L 27/0924* (2013.01); *H01L 29/7855* (2013.01)

(58) Field of Classification Search
CPC ....... H01L 29/66803; H01L 21/823431; H01L 21/823821; H01L 27/0924; H01L 29/7855; H01L 29/66666; H01L 29/7827
See application file for complete search history.

(56) References Cited

U.S. PATENT DOCUMENTS

| | | | |
|---|---|---|---|
| 9,461,143 B2 | 10/2016 | Pethe et al. | |
| 9,680,473 B1 | 6/2017 | Anderson et al. | |
| 10,381,480 B2 | 8/2019 | Alptekin et al. | |
| 10,665,692 B2 | 5/2020 | Xie et al. | |
| 10,930,555 B2 | 2/2021 | Wang et al. | |
| 10,943,990 B2 | 3/2021 | Greene et al. | |
| 11,004,687 B2 | 5/2021 | Thareja et al. | |
| 2019/0214343 A1* | 7/2019 | Lee | H01L 29/66666 |
| 2019/0319116 A1 | 10/2019 | Lee et al. | |
| 2021/0090990 A1 | 3/2021 | Hourani et al. | |

* cited by examiner

*Primary Examiner* — Fernando L Toledo
*Assistant Examiner* — Adam S Bowen
(74) *Attorney, Agent, or Firm* — Patterson + Sheridan, LLP

(57) ABSTRACT

An apparatus includes a fin, a gate, and a gate contact. A portion of the fin is disposed in a first layer. The gate is disposed in the first layer and adjacent to the fin. The gate contact is disposed on the gate and in a second layer, wherein the second layer is disposed on the first layer such that the gate contact is above the fin.

20 Claims, 16 Drawing Sheets

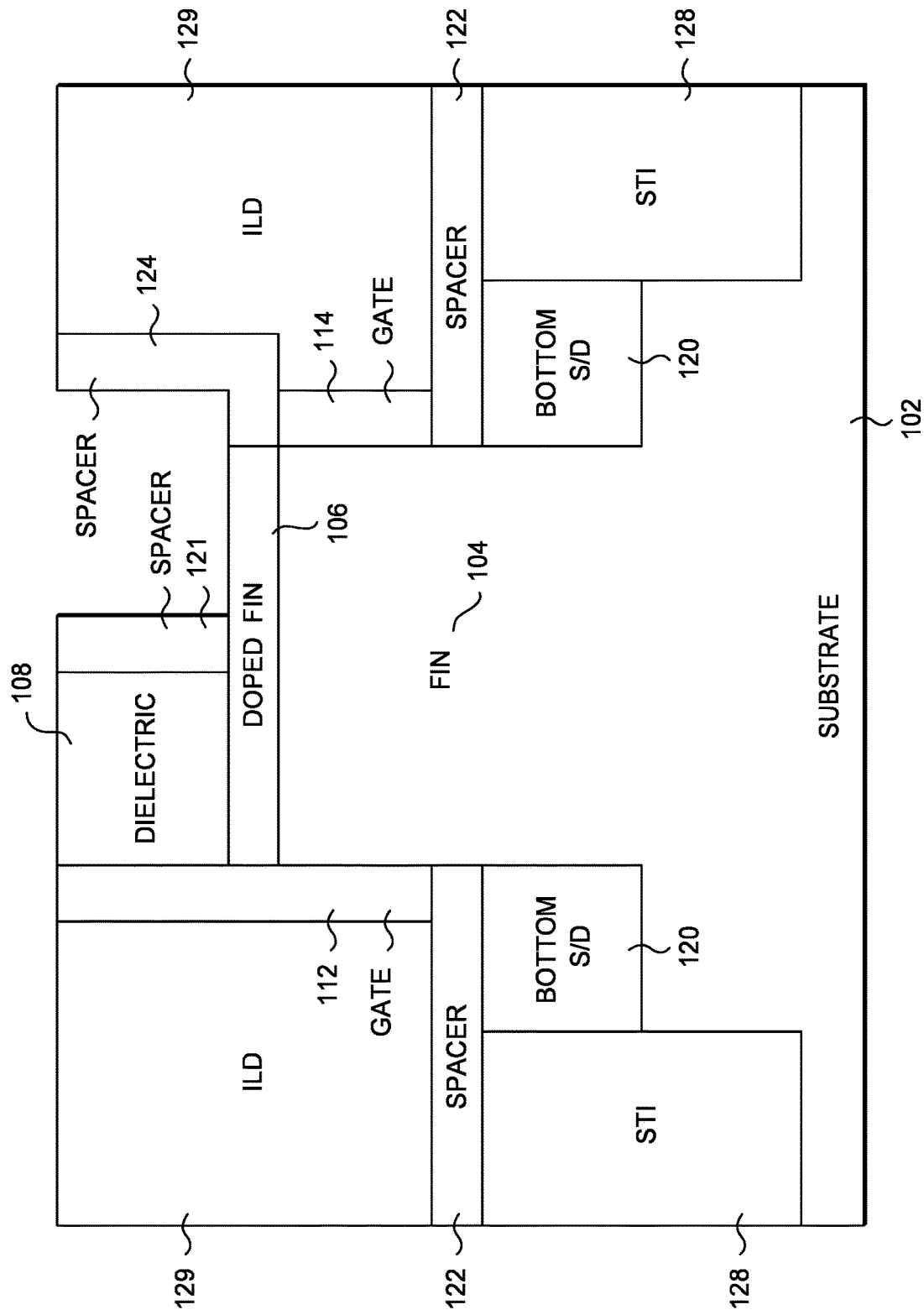

VERTICAL FET WITH CONTACT TO GATE ABOVE ACTIVE FIN

BACKGROUND

The present invention relates to field effect transistors, and more specifically, to vertical field effect transistors (VTFETs). In conventional VTFETs, a gate is formed laterally adjacent to a fin in the semiconductor stack. A gate contact is then formed laterally away from the fin such that the gate contact extends vertically upwards, parallel to the fin. To avoid short circuits, a gap is left between the gate contact and the fin. This gap, however, is wasted space and increases the size of the VTFET.

SUMMARY

According to an embodiment, an apparatus includes a fin, a gate, and a gate contact. A portion of the fin is disposed in a first layer. The gate is disposed in the first layer and adjacent to the fin. The gate contact is disposed on the gate and in a second layer, wherein the second layer is disposed on the first layer such that the gate contact is above the fin. Other embodiments include a method of forming the apparatus.

According to another embodiment, an apparatus includes a fin, a doped fin, a dielectric, a gate, and a gate contact. The doped fin is disposed on the fin. The dielectric is disposed on the doped fin. The gate is adjacent to the fin, the doped fin, and the dielectric. The gate contact is disposed on the gate and the dielectric.

BRIEF DESCRIPTION OF THE SEVERAL VIEWS OF THE DRAWINGS

FIG. 2H illustrates a step during the formation of the device of FIG. 1A.

DETAILED DESCRIPTION

This disclosure contemplates a VTFET that includes a gate contact that is formed above a fin in the semiconductor stack, rather than laterally away from the fin. Stated differently, the VTFET includes a gate contact that is aligned vertically with the fin in the semiconductor stack. As a result, the length or width of the VTFET is reduced relative to conventional VTFETs in which the gate contact is formed lateral to the fin and separated from the fin by a gap. Generally, a doped fin is disposed on the fin, and a dielectric is disposed on the doped fin. The fin and the doped fin may be formed by etching the substrate and a doped layer disposed on the substrate. A remaining portion of the substrate after etching forms the fin, and the remaining portion of the doped layer after etching forms the doped fin. A gate is then formed laterally adjacent to the fin, doped fin, and the dielectric. The gate contact is then disposed on the dielectric and the gate. As a result, the gate contact is stacked on the fin and separated from the fin by other layers in the semiconductor stack rather than a gap.

Figure 1A:
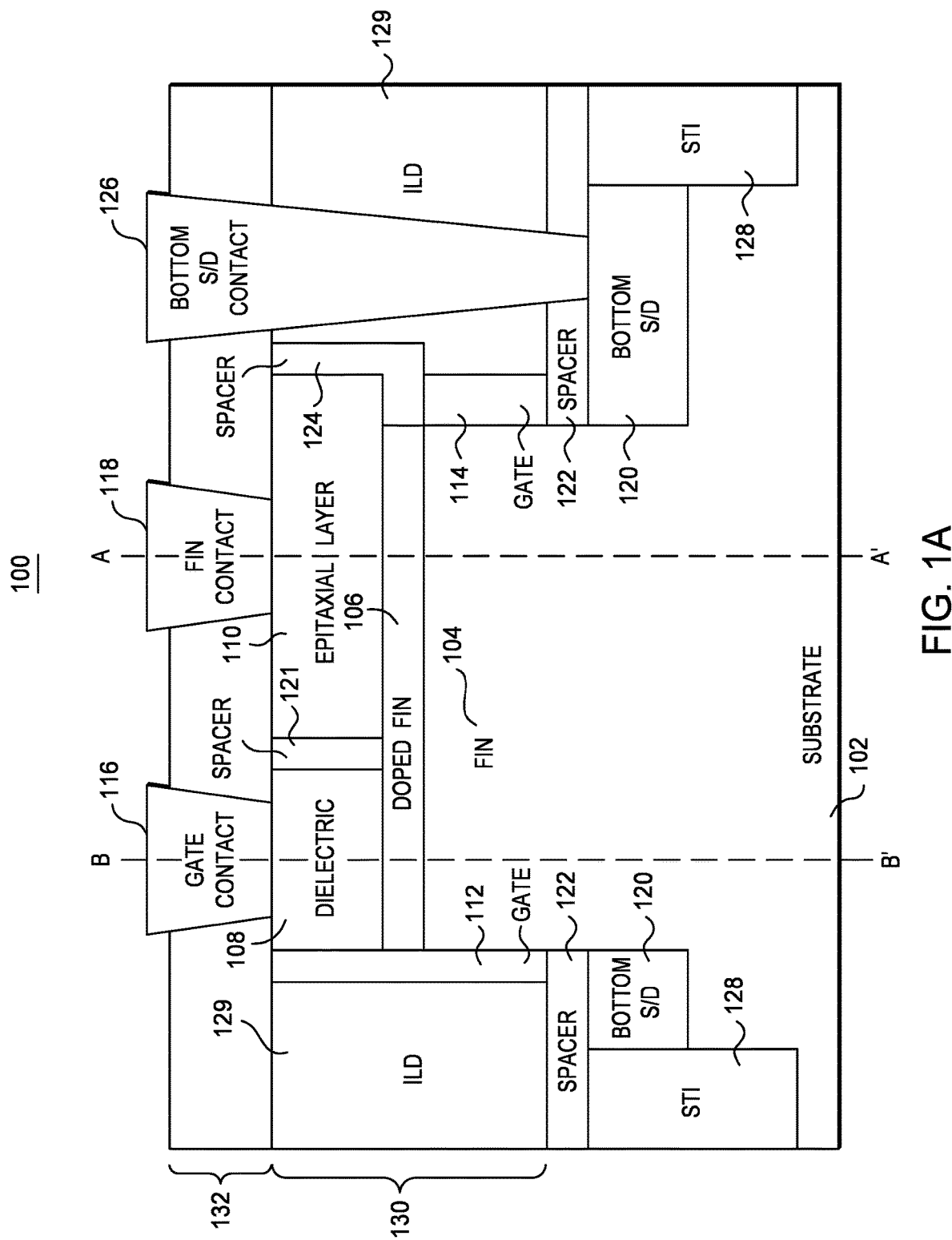
FIG. 1A illustrates a cross-section of an example device.

FIG. 1A illustrates a cross-section of an example device 100. As seen in FIG. 1A, the device 100 is a VTFET with various components arranged in a stack. Notably, the device 100 includes a gate contact 116 that is formed above a fin 104 in the stack such that the gate contact 116 is aligned vertically with the fin 104. In certain embodiments, because the gate contact 116 is formed above the fin 104 in the stack, the device 100 has a smaller length or width relative to other VTFETs that form the gate contact lateral to the fin with a gap between the gate contact and the fin. Specifically, by stacking the gate contact on the fin and separating the gate contact from the fin using other layers in the semiconductor stack, the length or width of the VTFET is smaller compared to conventional VTFETs that separate the gate contact laterally from the fin using a gap that creates unused lateral space.

The device 100 includes a substrate 102 at the bottom of the stack. The substrate 102 may include any suitable semiconductor material such as silicon, metal oxide, or gallium arsenide. The substrate 102 serves as a foundation for the construction of components in the device 100. A fin 104 is formed from the substrate 102. As seen in FIG. 1A, the fin 104 extends upwards from the substrate 102. The fin 104 may have been formed by etching away portions of the substrate 102 that are lateral to the fin 104. The fin 104 may be a top portion of the substrate 102 remaining after etching.

A doped fin 106 is disposed on the fin 104. In some embodiments, the fin 104 is also doped, but the doped fin 106 is more heavily doped than the fin 104. As seen in FIG. 1A, the doped fin 106 extends across the width of the fin 104. In certain embodiments, the doped fin 106 may be formed from a doped layer formed on the substrate 102 prior to etching the substrate 102. The doped fin 106 may be the remaining portions of the doped layer after etching. A dielectric 108 is disposed on the doped fin 106. The dielectric 108 may be etched such that the dielectric 108 does not extend across the width of the doped fin 106. The dielectric 108 may be formed using any insulative material. An epitaxial layer 110 is also disposed on the doped fin 106. The epitaxial layer 110 may include crystalline layers that are grown or deposited onto the doped fin 106.

A gate 112 is disposed laterally adjacent to the fin 104, the doped fin 106, and the dielectric 108 such that the gate 112 contacts the fin 104, the doped fin 106, and the dielectric 108. As seen in FIG. 1A, the gate 112 extends vertically upwards in the stack. The device 100 also includes a gate 114 disposed laterally adjacent to the opposite side of the fin 104 as the gate 112. As seen in FIG. 1A, the gate 114 extends vertically upwards in the stack along the fin 104 such that the gate 114 contacts the fin 104. The gate 114 does not extend laterally adjacent to the doped fin 106 or the epitaxial layer 110. In some embodiments, the gate 112 and the gate 114 are connected at other portions of the device 100 not shown in the cross-section of FIG. 1A.

The gate contact 116 may include any suitable conductive material. As seen in FIG. 1A, the gate contact 116 is disposed on the dielectric 108 such that the gate contact 116 contacts the dielectric 108. Although not shown here, as seen in subsequent figures showing other cross-sections of the device 100, the gate contact 116 contacts the gate 112 and allows an electrical connection to be made to the gate. The device 100 includes a fin contact 118 disposed on the epitaxial layer 110. The fin contact 118 may include any suitable conductive material. Generally, the fin contact 118 allows an electrical connection to be made to the fin 104, the epitaxial layer 110, or the doped fin 106.

The device 100 also includes a bottom source/drain region 120 formed on the substrate 102. The bottom source/drain region 120 may be formed on the substrate 102 after the substrate 102 has been etched to form the fin 104. A spacer 122 is used to separate the bottom source/drain region 120 from the gates 112 and 114. The spacers 122 may be any insulative material that separates the bottom source/drain region 120 from the gates 112 and 114.

A spacer 121 is positioned between the dielectric 108 and the epitaxial layer 110. The spacer 121 is an insulative material that separates the dielectric 108 and the epitaxial layer 110. Additionally, a spacer 124 is positioned between the epitaxial layer 110 and the gate 114. The spacer 124 is any suitable insulative material that separates the epitaxial layer 110 from the gate 114.

The device 100 may include a bottom source/drain contact 126 that is lateral to and away from the epitaxial layer 110, the doped fin 106, and the fin 104 (e.g., there may be a gap between the bottom source/drain contact 126 and the fin 104, doped fin 106, and epitaxial layer 110). The bottom source/drain contact 126 may include any suitable conductive material. The bottom source/drain contact 126 may extend upwards from the bottom source/drain region 120 to the top of the stack. The bottom source/drain contact 126 allows an electrical connection to be made to the bottom source/drain region 120.

Shallow trench isolation (STI) 128 and an interlayer dielectric (ILD) 129 fill some of the remaining portions of the device 100. Generally, STI 128 and ILD 129 prevent electric current leakage between components of the device 100. As seen in FIG. 1A, STI 128 is positioned adjacent to the bottom source/drain region 120 and ILD 129 is positioned adjacent to the gates 112 and 114.

Certain components of the device 100 form a layer 130 and a layer 132. Generally, the layer 132 is disposed on the layer 130 in the stack. The layer 130 includes a portion of the fin 104, the doped fin 106, the dielectric 108, the epitaxial layer 110, the gate 112, and the gate 114. The layer 132 includes the gate contact 116, the fin contact 118, and a portion of the bottom source/drain contact 126. In certain embodiments, the gate contact 116, the fin contact 118, and the portion of the bottom source/drain contact 126 may be formed in a dielectric or insulative material in the layer 132. The layer 132 and the layer 130 are aligned such that the gate contact 116 is aligned vertically with the fin 104 in the semiconductor stack.

Figure 1B:
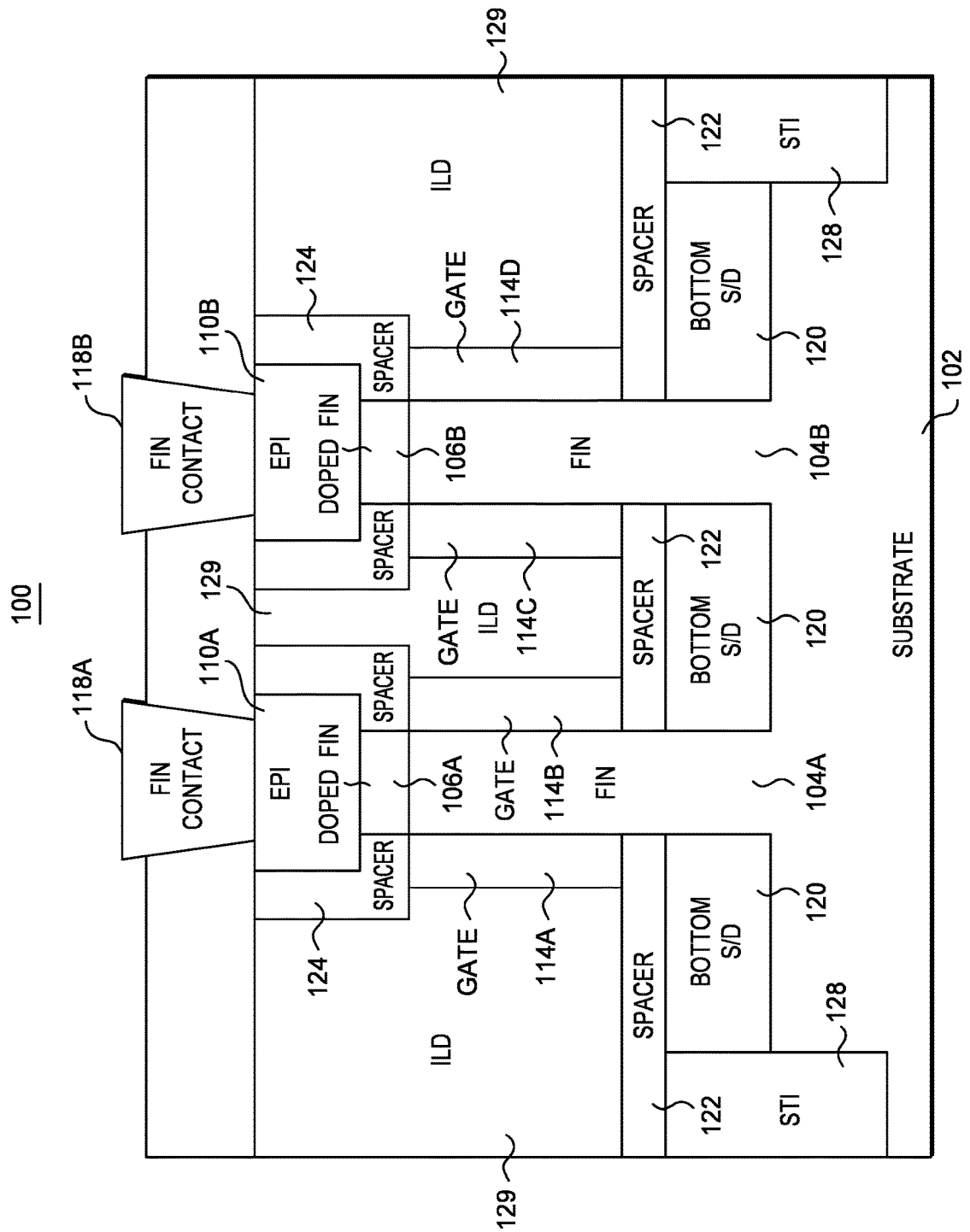
FIG. 1B illustrates a cross-section of the device of FIG. 1A.

FIG. 1B illustrates a cross-section of the device 100 of FIG. 1A. Specifically, FIG. 1B shows a cross-sectional view of the device 100 labeled AA' in FIG. 1A. As seen in FIG. 1B, the device 100 may include multiple fins 104, epitaxial layers 110, and fin contacts 118. Additionally, multiple gates 114 may be formed laterally adjacent to the fins 104 such that these gates 114 contact one or more of the fins 104.

In the example of FIG. 1B, the device 100 includes a fin 104A and a fin 104B formed from the substrate 102. For example, the fins 104A and 104B may have been formed by etching the substrate 102. The fins 104A and 104B extend upwards from the substrate 102 towards the top of the stack. Doped fins 106A and 106B are disposed on the fins 104A and 104B, respectively. Additionally, epitaxial layers 110A and 110B are disposed on the doped fins 106A and 106B, respectively. Fin contacts 118A and 118B are disposed on the epitaxial layers 110A and 110B, respectively.

Multiple gates 114 are formed laterally adjacent to the fins 104A and 104B. In the example of FIG. 1B, gates 114A and 114B are formed laterally adjacent to the fin 104A such that the gates 114A and 114B contact the fin 104A. Additionally, gates 114C and 114D are disposed laterally adjacent to the fin 104B such that the gates 114C and 114D contact the fin 104B. In certain embodiments, a connector connects the gates 114B and 114C to each other. The connector may be disposed on the spacer 122 in the region between the fins 104A and 104B.

Figure 1C:
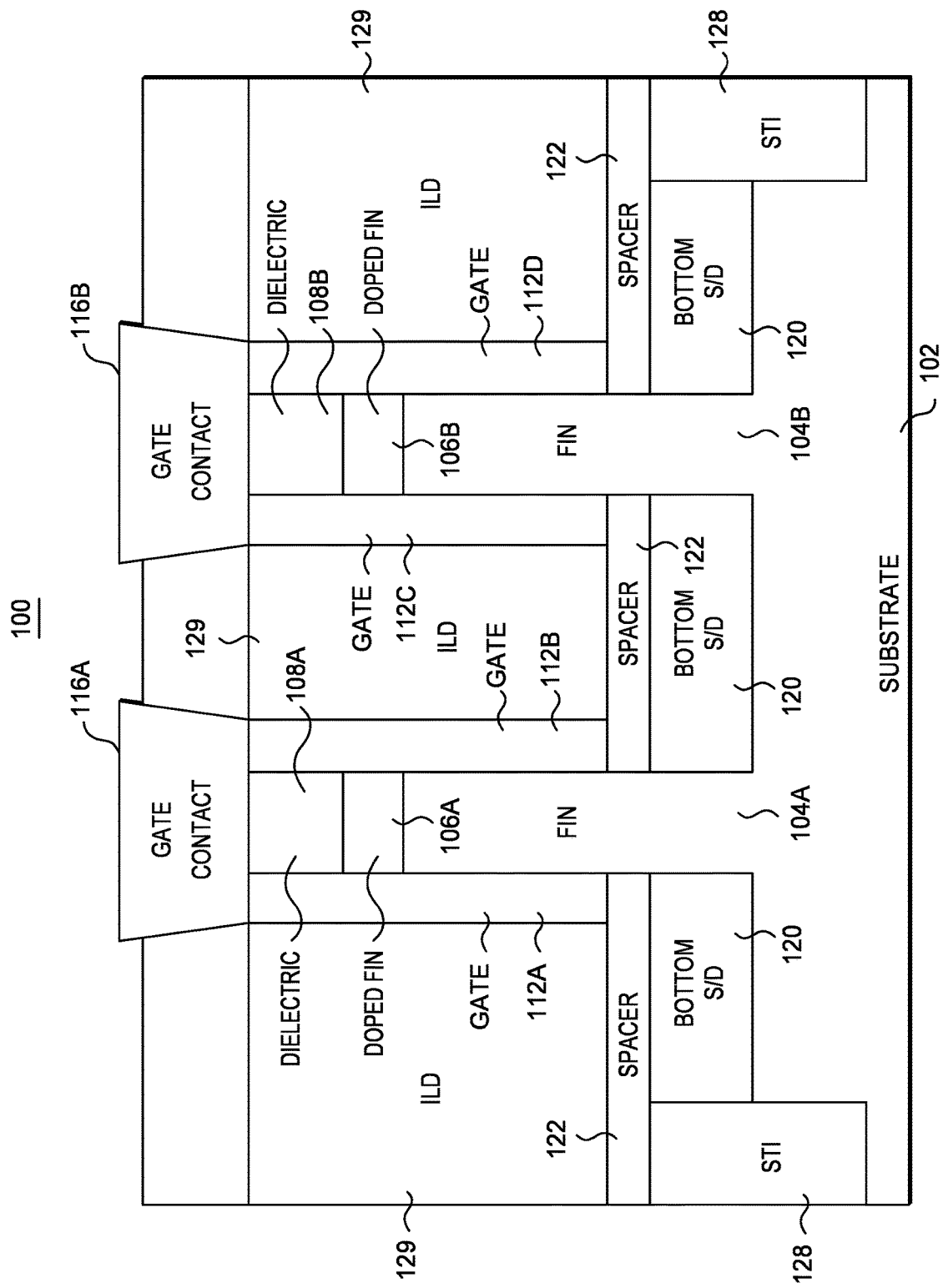
FIG. 1C illustrates a cross-section of the device of FIG. 1A.

FIG. 1C illustrates a cross-section of the device 100 of FIG. 1A. Specifically, FIG. 1C shows a cross-section of the device 100 labeled BB' in FIG. 1A. As seen in FIG. 1C, the device 100 may include multiple fins 104 and gate contacts 116.

The device 100 includes fins 104A and 104B formed from the substrate 102. The fins 104A and 104B extend upwards from the substrate 102 towards the top of the stack. In certain embodiments, the fins 104A and 104B are formed from the substrate 102 by etching the substrate 102. Doped fins 106A and 106B are disposed on the fins 104A and 104B, respectively. Dielectrics 108A and 108B are disposed on the doped fins 106A and 106B, respectively. Gate contacts 116A and 116B are disposed on the dielectrics 108A and 108B, respectfully. As a result, the gate contacts 116A and 116B are formed above the fins 104A and 104B in the stack.

The device 100 also includes multiple gates 112 disposed laterally adjacent to the fins 104A and 104B. In the example of FIG. 1C, the gates 112A and 112B are disposed laterally adjacent to the fin 104A such that the gates 112A and 112B contact the fin 104A. Additionally, gates 112C and 112D are disposed laterally adjacent to the fin 104B such that the gates 112C and 112D contact the fin 104B. Moreover, the gates 112 contact the gate contacts 116. Specifically, the gates 112A and 112B contact the gate contact 116A and the gates 112C and 112D contact the gate contact 116B. As a result, the gate contacts 116A and 116B allow for electrical connections to be made to the gates 112A, 112B, 112C, and 112D.

In certain embodiments, the gates 112C and 112D may be connected to each other in a region between the gate contact 116B and the dielectric 108B. As a result, the gates 112C and 112D are connected to each other across the bottom of the gate contact 116B. In some embodiments, the gates 112B and 112C are connected to each other by a connector disposed on the spacer 122. The connector may be positioned between the gates 112B and 112C.

As seen in FIG. 1C, the gate contacts 116A and 116B are disposed above the fins 104A and 104B in the stack rather than laterally away from fins 104A and 104B. As a result, there does not need to be a gap between the gate contacts 116A and 116B and the fins 104A and 104B to avoid short circuits. Thus, the size of the device 100 is smaller than other VTFETs in which the gate contacts 116A and 116B are disposed laterally away from the fins 104A and 104B, in certain embodiments.

Figure 1D:
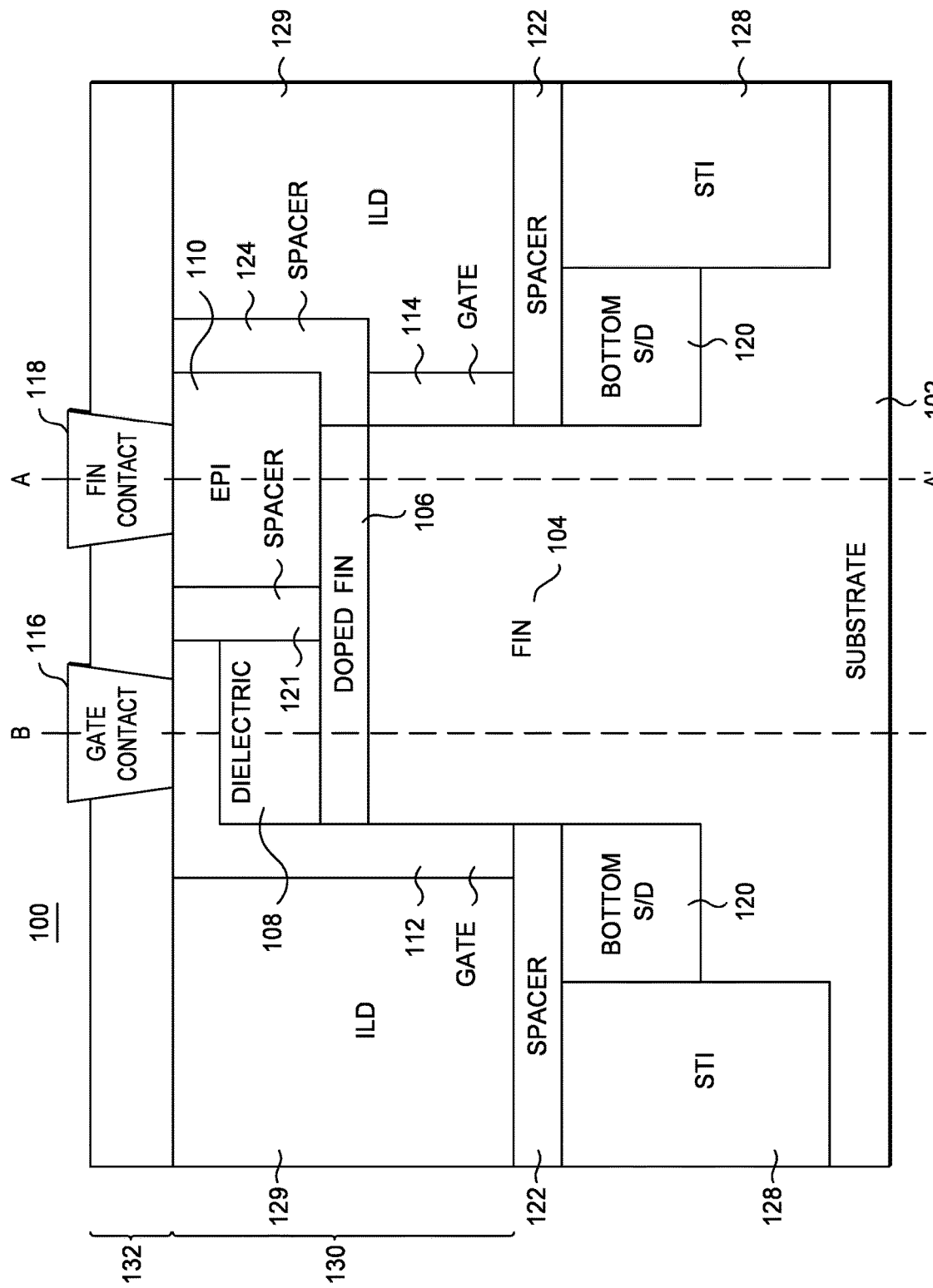
FIG. 1D illustrates a cross-section of an alternative design of the device of FIG. 1A.

FIG. 1D illustrates a cross-section of an alternative design of the device of FIG. 1A. As seen in FIG. 1D, the device 100 includes a gate 112 disposed adjacent to the fin 104, the doped fin 106, and the dielectric 108 such that the gate 112 contacts the fin 104, the doped fin 106, and the dielectric 108. Additionally, the gate 112 extends across the top of the dielectric 108 to the spacer 121. The gate contact 116 is disposed on the gate 112 above the dielectric 108, the doped fin 106, and the fin 104. The cross-section of the device 100 labeled AA' in FIG. 1D is the same as the cross-section shown in FIG. 1B. As with the design in FIG. 1A, there may be a bottom source/drain contact formed through the ILD 129 and the spacer 122 to contact the bottom source/drain region 120 in the design of FIG. 1D.

Figure 1E:
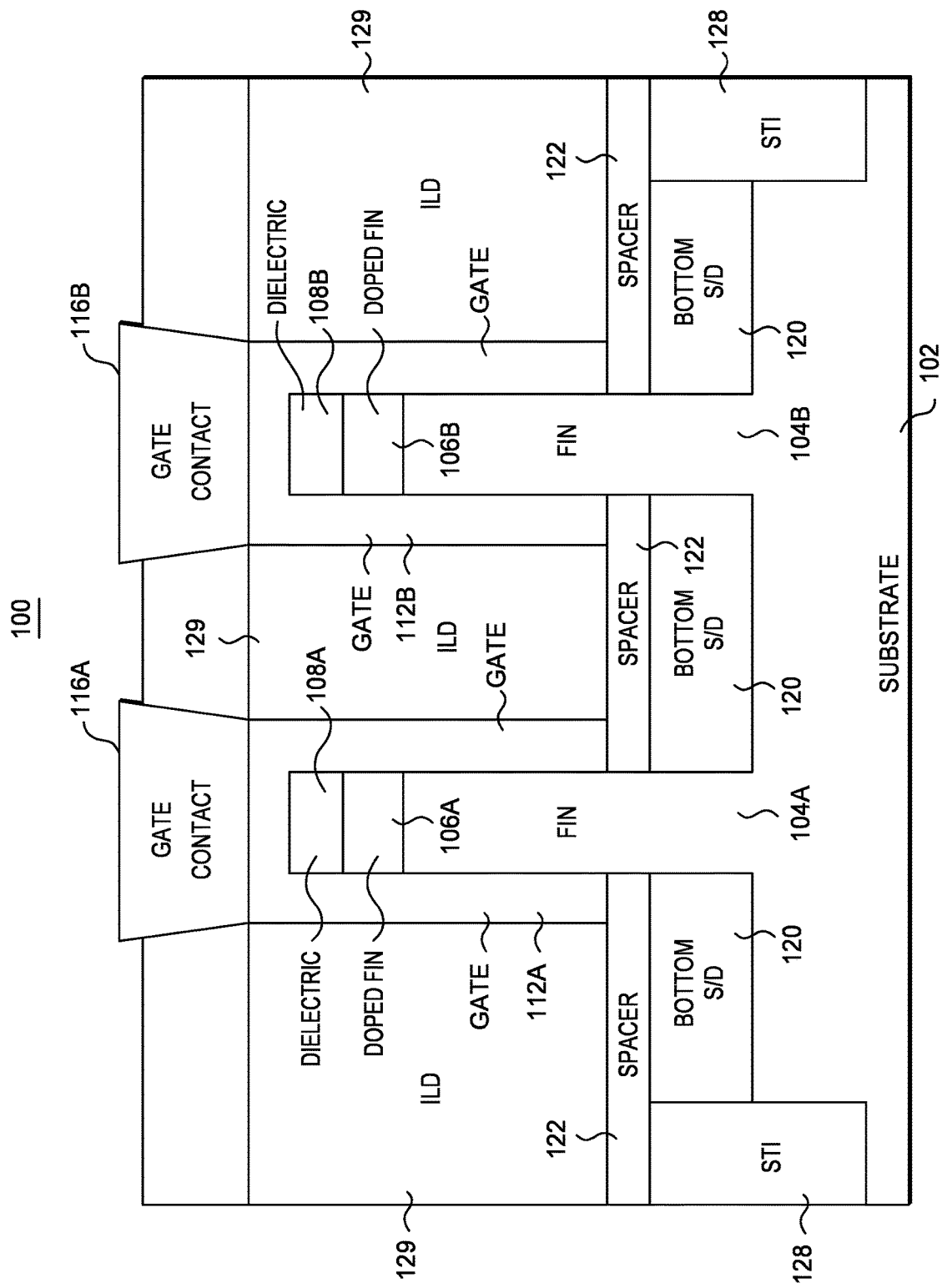
FIG. 1E illustrates a cross-section of the device of FIG. 1D.

FIG. 1E illustrates a cross-section of the device 100 of FIG. 1D. Specifically, FIG. 1E shows a cross-section of the device 100 labeled BB' in FIG. 1D. As seen in FIG. 1E, the device 100 includes multiple fins 104A and 104B, doped fins 106A and 106B, dielectrics 108A and 108B, gates 112A and 112B, and gate contacts 116A and 116B. The gate 112A is disposed adjacent to the fin 104A, doped fin 106A, and dielectric 108A such that the gate 112A contacts the fin 104A, the doped fin 106A, and the dielectric 108A on opposing sides of the fin 104A, doped fin 106A, and dielectric 108A. Additionally, the gate 112A extends across the top of the dielectric 108A in the region between the gate contact 116A and the dielectric 108A. The gate contact 116A is disposed on the gate 112A above the dielectric 108A, the doped fin 106A, and the fin 104A. The gate 112B is disposed adjacent to the fin 104B, doped fin 106B, and dielectric 108B such that the gate 112B contacts the fin 104B, the doped fin 106B, and the dielectric 108B on opposing sides of the fin 104B, doped fin 106B, and dielectric 108B. Additionally, the gate 112B extends across the top of the dielectric 108B in the region between the gate contact 116B and the dielectric 108B. The gate contact 116B is disposed on the gate 112B above the dielectric 108B, the doped fin 106B, and the fin 104B.

Figure 2A:
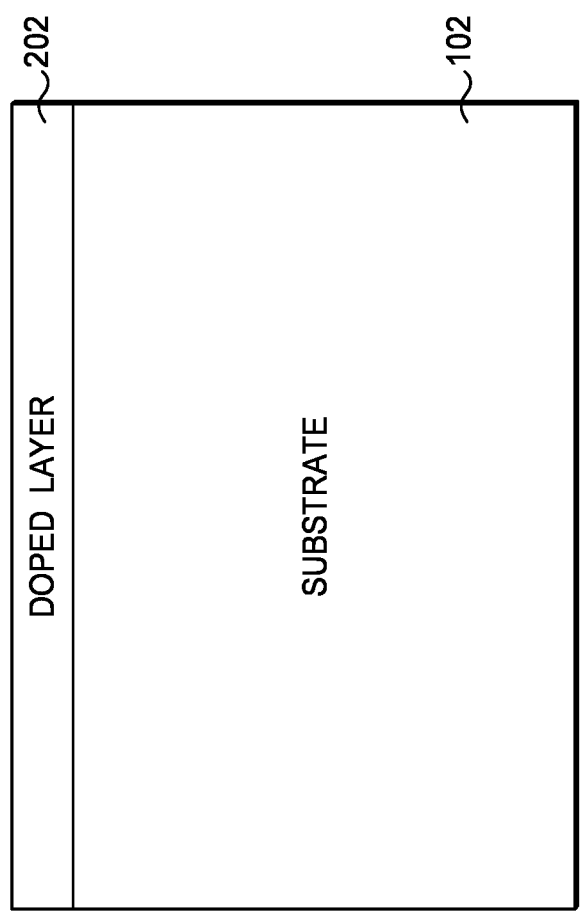
FIG. 2A illustrates a step during the formation of the device of FIG. 1A.

FIGS. 2A through 2J illustrate steps during the formation of the device 100 of FIG. 1A. As seen in FIG. 2A, the process of forming the device 100 begins by forming a doped layer 202 on the substrate 102. The doped layer 202 is disposed on the top of the substrate 102 in the stack. The doped layer 202 may be formed using any suitable process for doping a top layer of the substrate 102. During the doping process, a dopant may be introduced to the top layer of the substrate 102. The substrate 102 may react with the dopant to produce the doped layer 202. The doped layer 202 and the substrate 102 may be etched to form the fin 104 and the doped fin 106 shown in FIG. 1A.

Figure 2B:
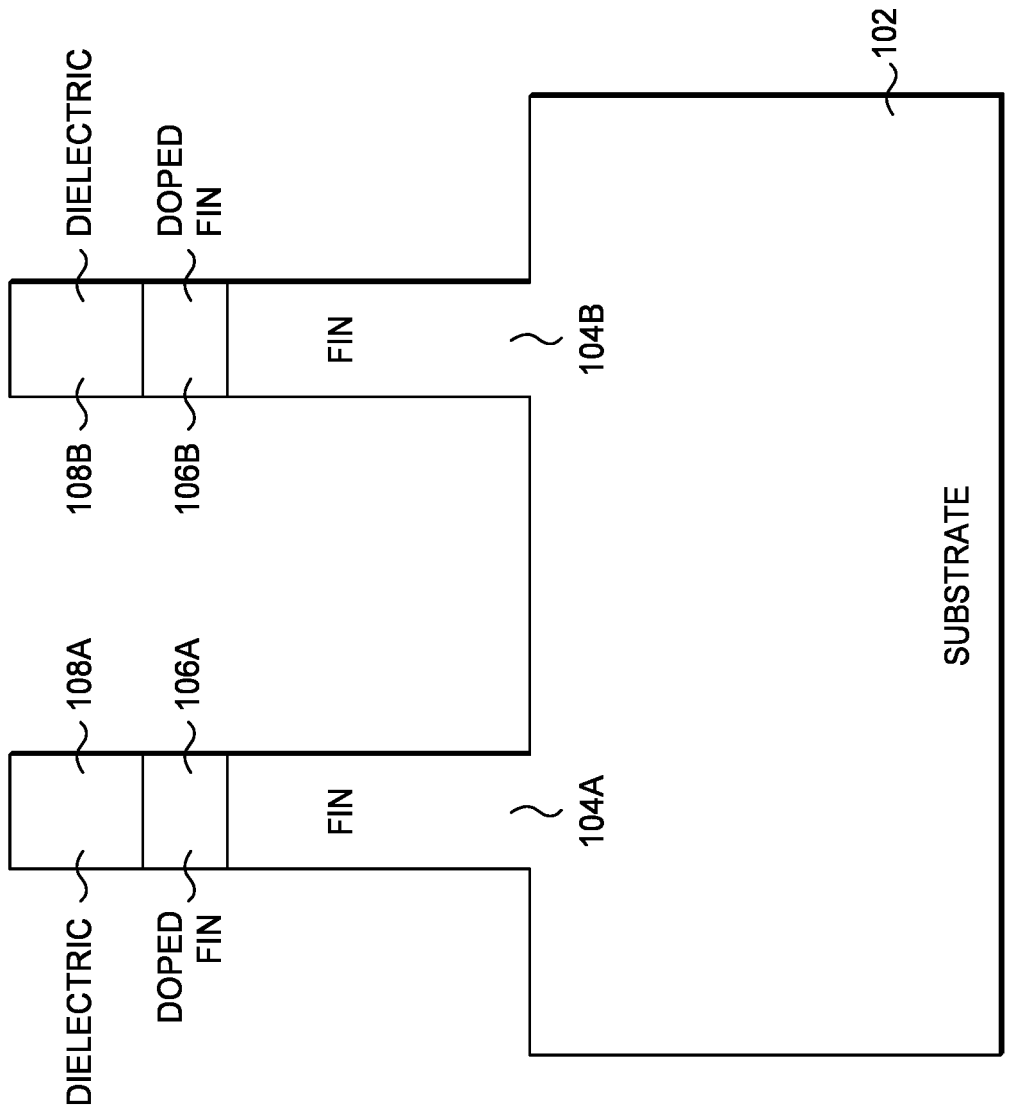
FIG. 2B illustrates a step during the formation of the device of FIG. 1A.

FIG. 2B shows the result of etching. The perspective of the device 100 shown in FIG. 2B is along the cross-section labeled BB' in FIG. 1A. As seen in FIG. 2B, the substrate 102 has been etched to form the fins 104A and 104B. The doped fins 106A and 106B are disposed on the fins 104A and 104B. As discussed previously, the doped fins 106A and 106B may be etched from the doped layer 202 formed on the substrate 102. Additionally, the dielectrics 108A and 108B are disposed on the doped fins 106A and 106B. In certain embodiments, the dielectrics 108A and 108B are formed by first depositing a dielectric on the doped layer 202 and then etching the dielectric along with the doped layer 202 and the substrate 102. In some embodiments, the dielectrics 108A and 108B are disposed on the doped fins 106A and 106B after etching the doped layer 202 and the substrate 102.

Figure 2C:
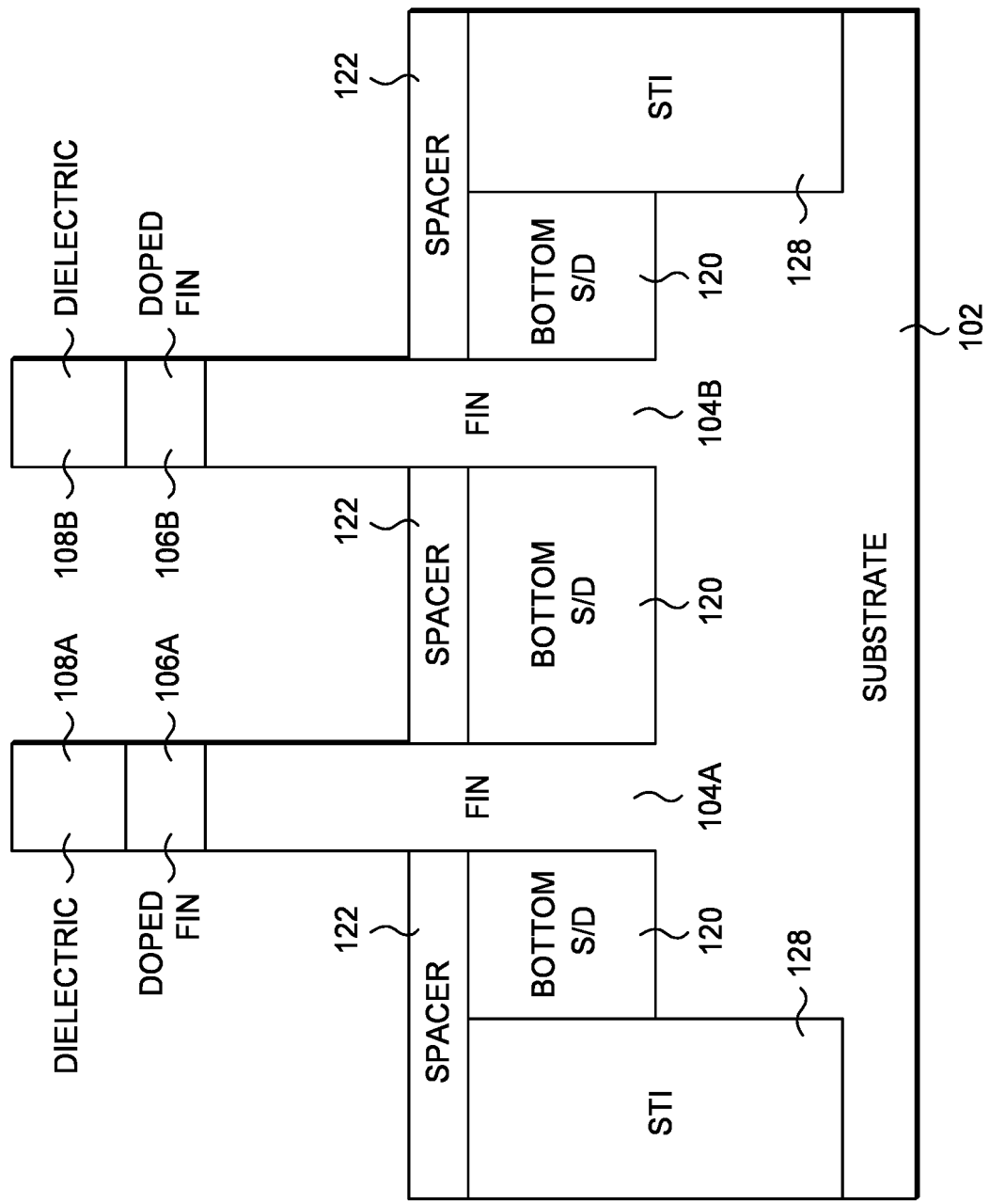
FIG. 2C illustrates a step during the formation of the device of FIG. 1A.

As shown in FIG. 2C, after etching, the bottom source/drain region 120 is formed on the substrate 102. Additionally, STI 128 is added to fill the space lateral to the substrate 102 and the bottom source/drain region 120. A spacer 122 is also disposed on the STI 128 and the bottom source/drain region 120.

Figure 2D:
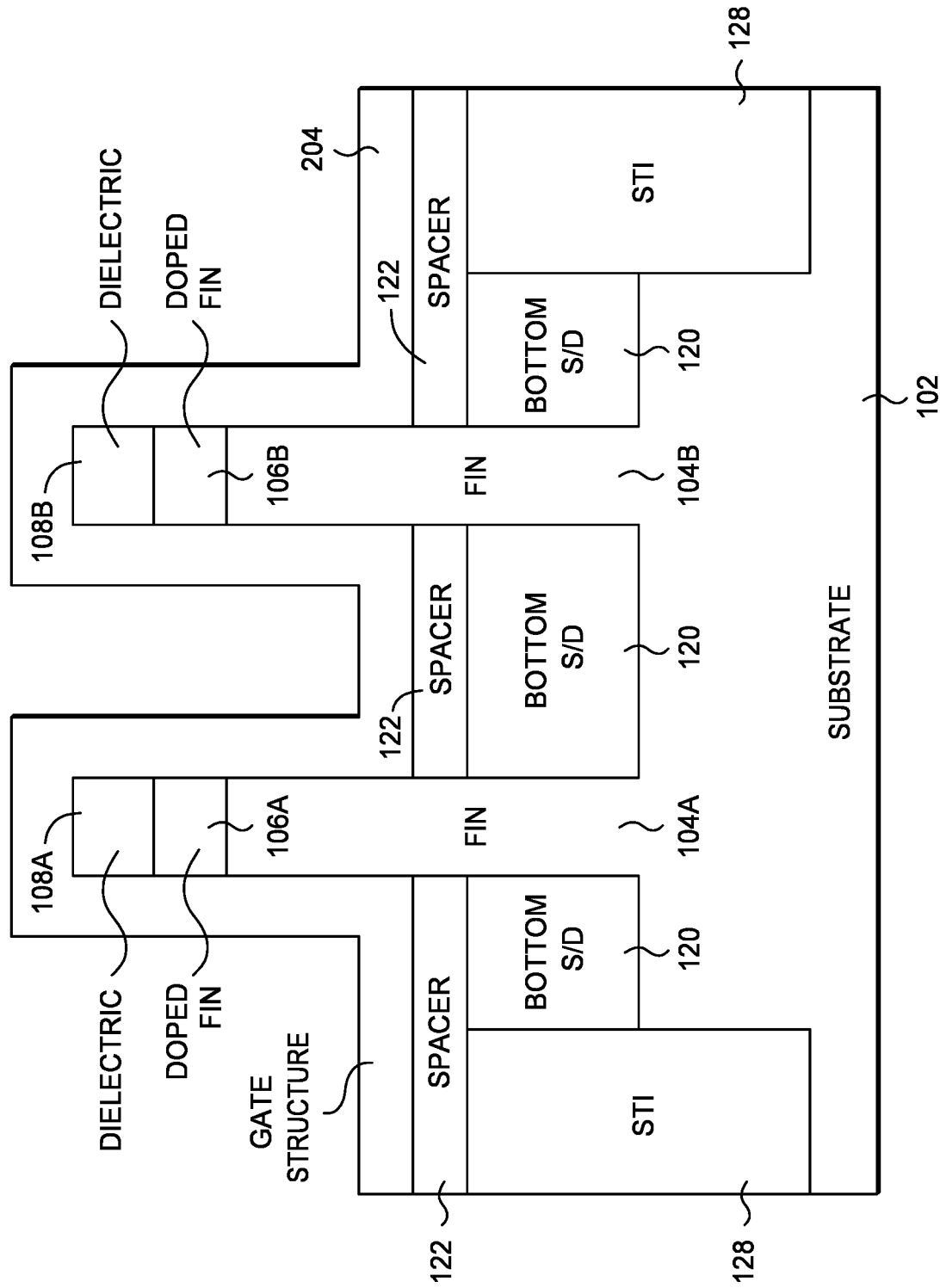
FIG. 2D illustrates a step during the formation of the device of FIG. 1A.

As seen in FIG. 2D, a gate structure 204 is then deposited onto the spacer 122. The gate structure 204 covers the spacer 122 and the dielectrics 108A and 108B. Additionally, the gate structure 204 covers the lateral sides of the fins 104A and 104B, the doped fins 106a and 106B, and the dielectrics 108A and 108B. The gate structure 204 may be a single, continuous structure that from which the individual gates are formed.

Figure 2E:
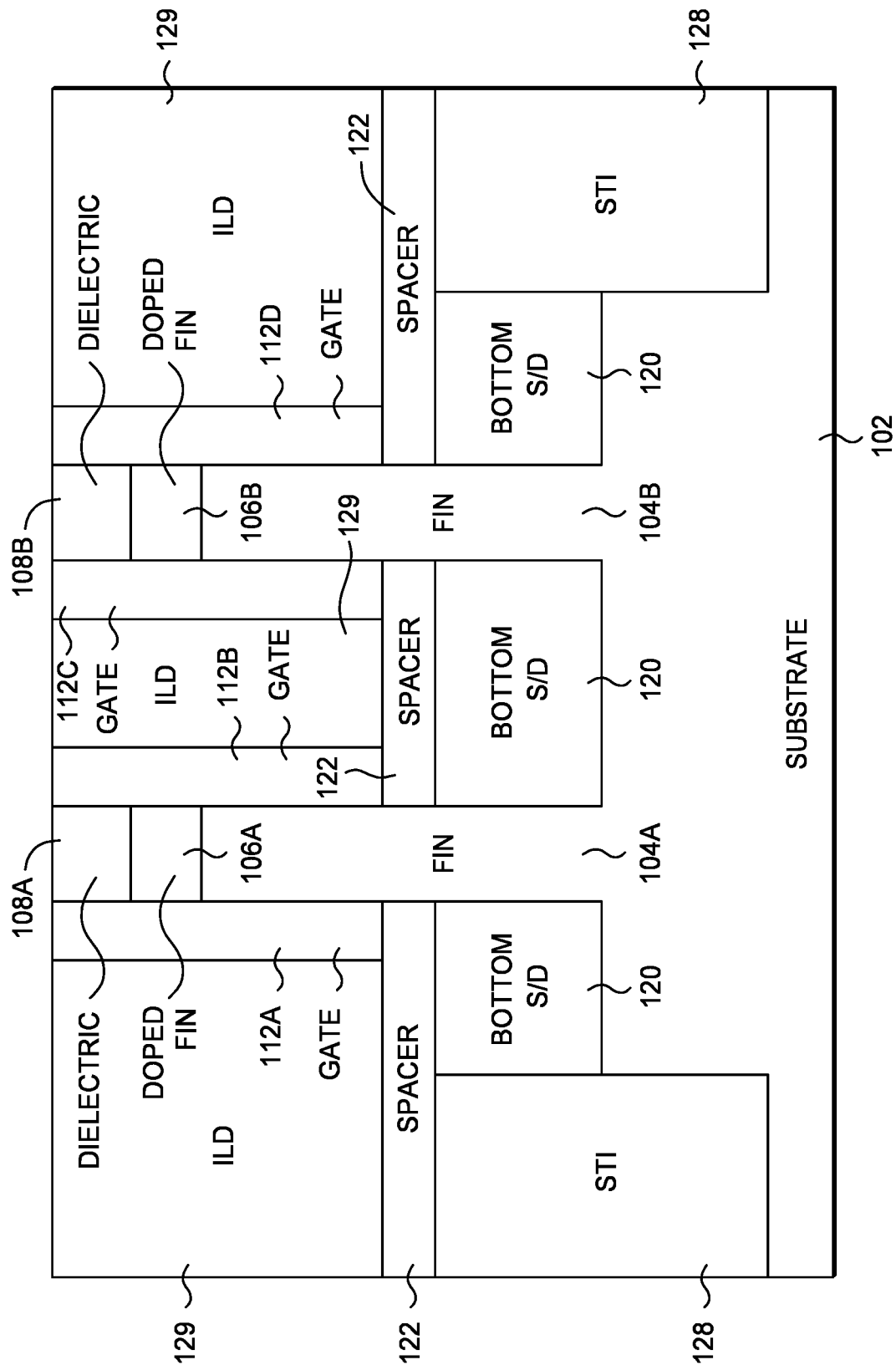
FIG. 2E illustrates a step during the formation of the device of FIG. 1A.

The gate structure 204 is then etched. As seen in FIG. 2E, the gate structure 204 is etched to form the gates 112A, 112B, 112C and 112D. ILD 129 is added to fill the space lateral to the gates 112A, 112B, 112C, and 112D. As discussed previously, in some embodiments, a portion of the gate structure 204 above the dielectrics 108A and 108B is left after etching such that these portions of the gate structure 204 connect the gates 112A and 112B to each other and the gates 112C and 112D to each other (e.g., as shown in FIGS. 1D and 1E). Additionally, in some embodiments, a portion of the gate structure 204 between the gates 112B and 112C is left after etching such that this portion of the gate structure 204 connects the gates 112B and 112C.

Figure 2F:
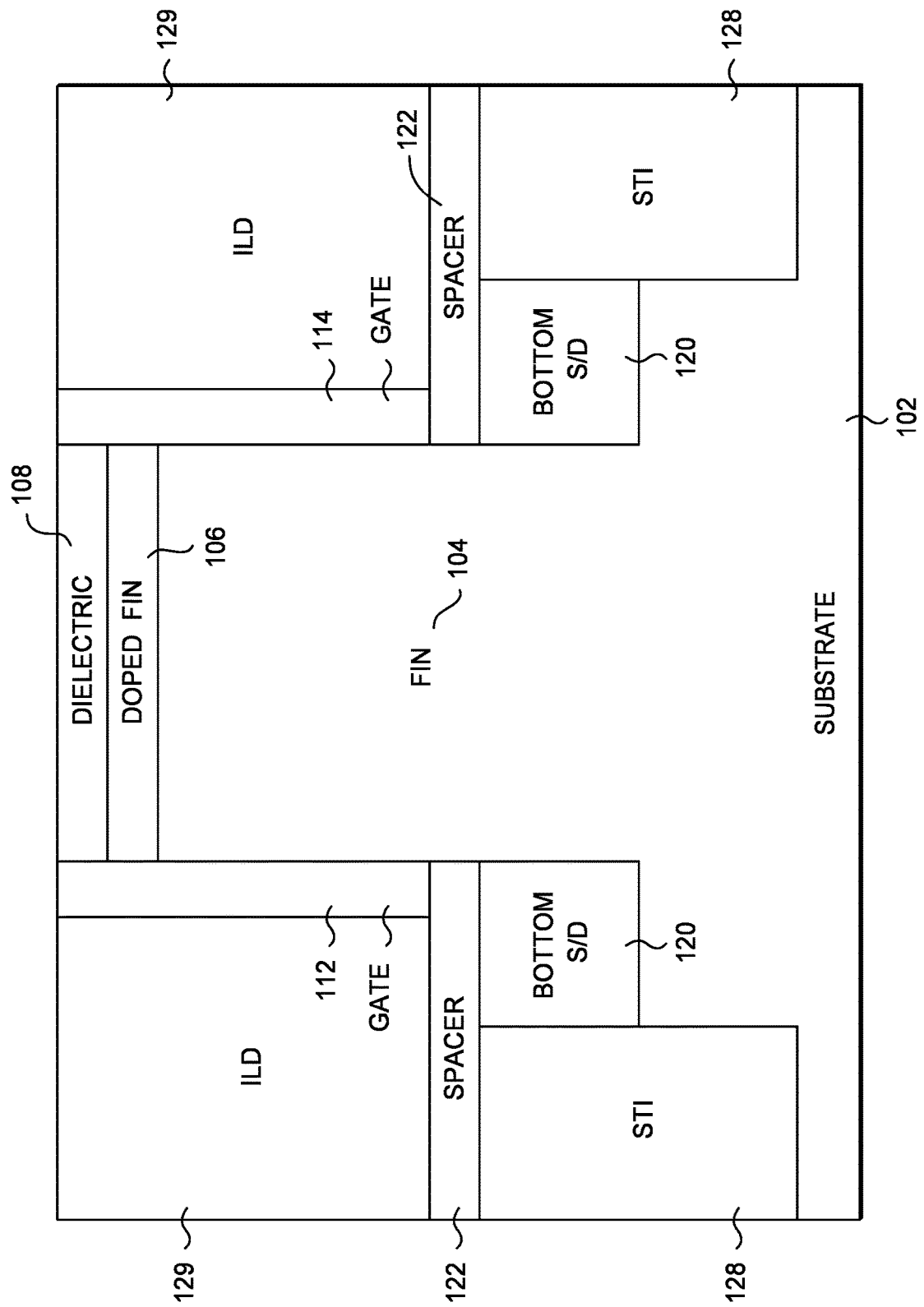
FIG. 2F illustrates a step during the formation of the device of FIG. 1A.

FIG. 2F shows a different cross-sectional view of the device shown in FIG. 2E. As seen in FIG. 2F, the fin 104 (which may be the fin 104A or 104B in FIG. 2E) is formed from the substrate 102. The doped fin 106 (which may be the doped fin 106A or 106B in FIG. 2E) is disposed on the fin 104. The dielectric 108 (which may be the dielectric 108A or 108B) is disposed on the doped fin 106. Additionally, the gates 112 and 114 are laterally adjacent to the fin 104, the doped fin 106, and the dielectric 108.

Figure 2G:
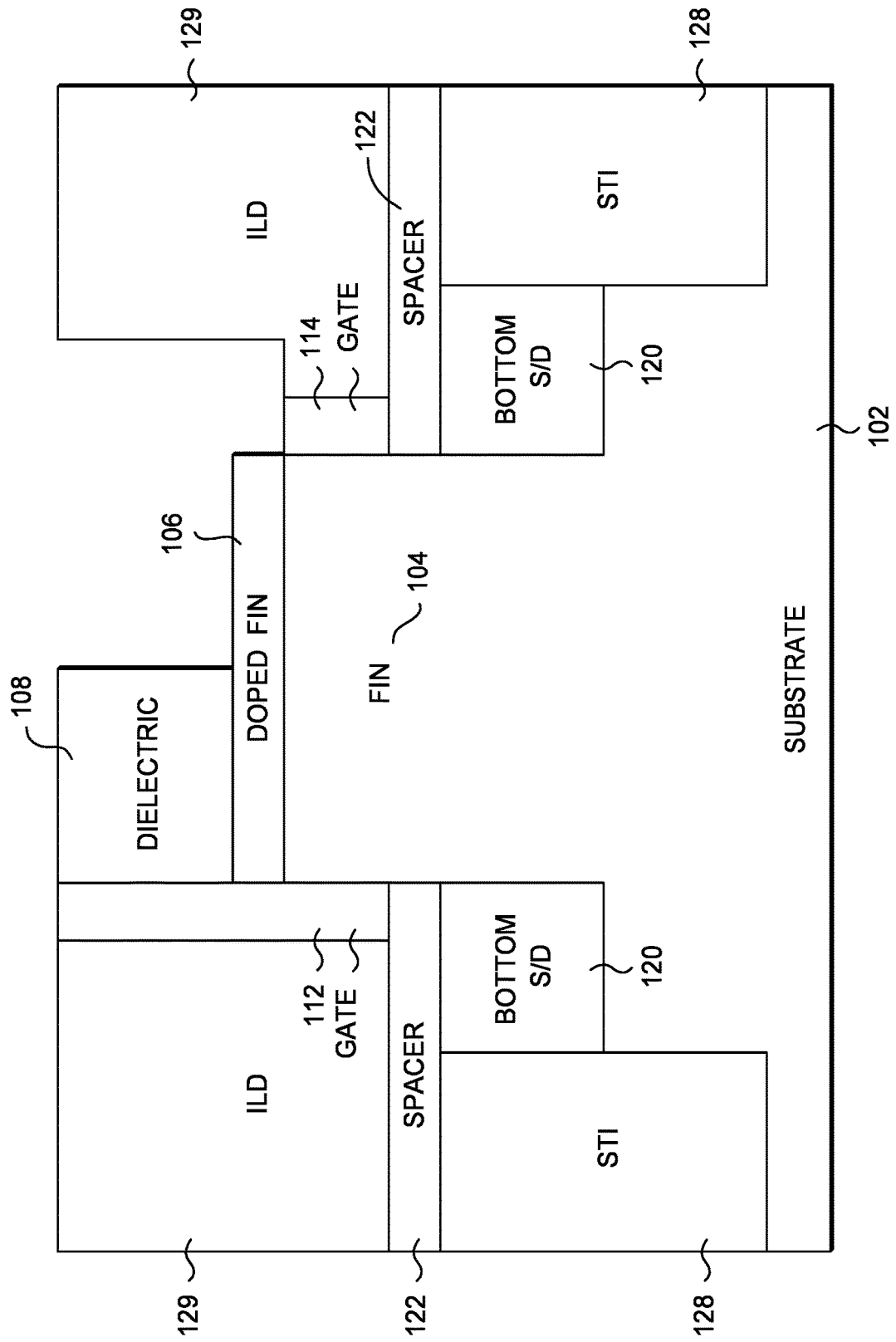
FIG. 2G illustrates a step during the formation of the device of FIG. 1A.
Figure 2I:
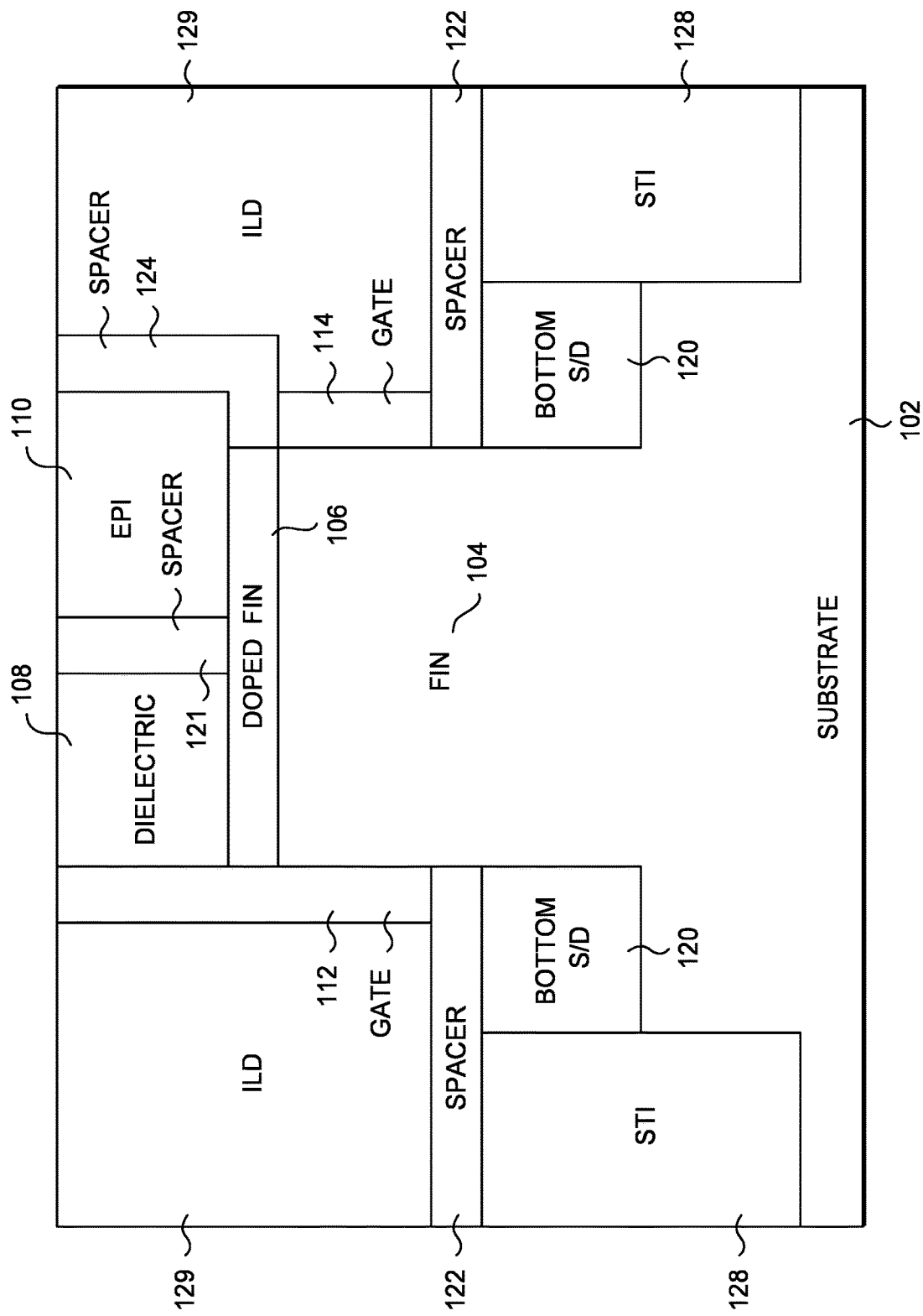
FIG. 2I illustrates a step during the formation of the device of FIG. 1A.

The dielectric 108 and the gate 114 are then etched. As seen in FIG. 2G, the etching removes a portion of the dielectric 108 and the gate 114. Specifically, the dielectric 108 is etched such that the dielectric 108 extends laterally across only a portion of the width of doped fin 106. Additionally, the gate 114 is etched to expose a sidewall of the doped fin 106. As a result, the gate 114 does not extend upwards across the sidewall of the doped fin 106. Spacers are then disposed in the etched space. As seen in FIG. 2H, a spacer 121 is disposed adjacent to the dielectric 108 and on the doped fin 106. Additionally, the spacer 124 is disposed on the gate 114 and adjacent to the doped fin 106. The spacers 121 and 124 may be any suitable insulative material. The epitaxial layer 110 is then grown or deposited in the remaining space. As seen in FIG. 2I, the epitaxial layer 110 is deposited or grown on the doped fin 106 between the spacers 121 and 124. The spacers 121 and 124 separate the epitaxial layer 110 from the dielectric 108 and the gate 114.

Figure 2J:
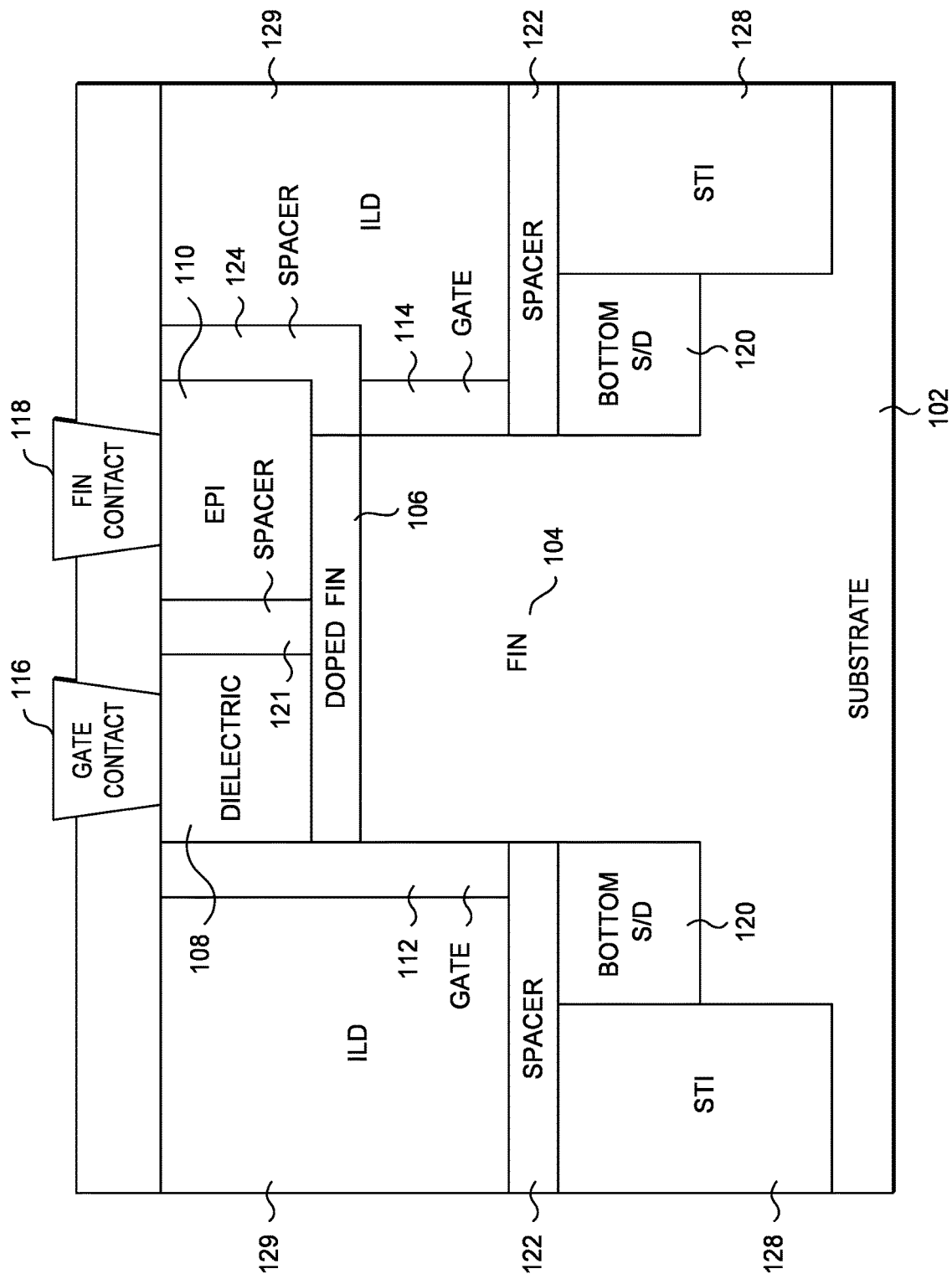
FIG. 2J illustrates a step during the formation of the device of FIG. 1A.

Contacts are then formed. As seen in FIG. 2J, the gate contact 116 is formed on the dielectric 108, and the fin contact 118 is formed on the epitaxial layer 110. The gate contact 116 is disposed above the fin 104 in the stack. In some embodiments, the gate contact 116 and the fin contact 118 are formed in and through a dielectric layer or insulative material that is separate and different from the dielectric 108.

Figure 3:
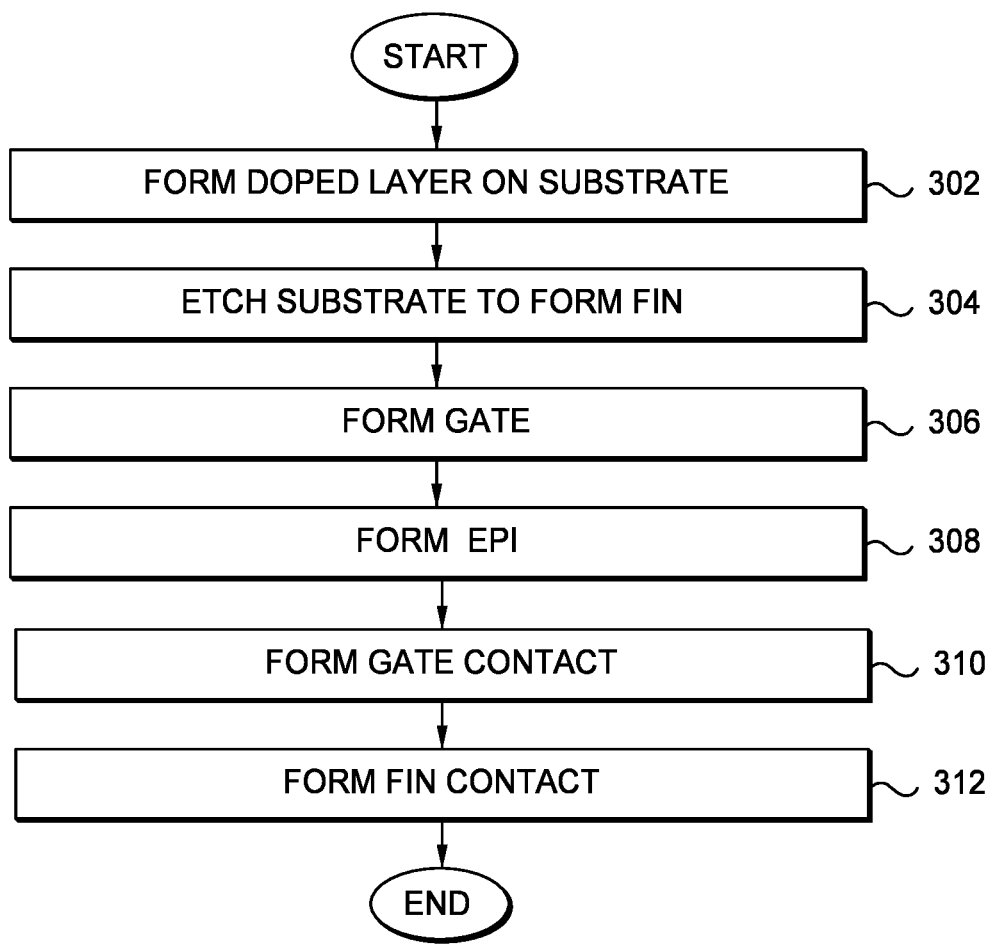
FIG. 3 is a flowchart of an example method for forming the device of FIG. 1A.

FIG. 3 is a flowchart of an example method 300 for forming the device 100 of FIG. 1A. In certain embodiments, semiconductor fabrication machines or an operator perform the method 300. By performing the method 300, a gate contact 116 is formed above a fin 104 in the semiconductor stack rather than laterally away from the fin 104. The resulting device 100 is smaller relative to other devices in which the gate contact is formed laterally away from the fin, in certain embodiments.

In block 302, a doped layer 202 is formed on a substrate 102. The doped layer 202 may be disposed across the top of the substrate 102 in the semiconductor stack. In block 304, the substrate 102 is etched to form the fin 104. Additionally, the doped layer 202 may be etched to form a doped fin 106. As a result, the fin 104 is disposed on the substrate 102 and the doped fin 106 is disposed on the fin 104. In some embodiments, a dielectric 108 is disposed on the doped fin 106. The dielectric 108 may be disposed on the doped layer 202 prior to etching, or the dielectric 108 may be disposed on the doped fin 106 after etching.

In block 306, a gate 112 is formed. The gate 112 is laterally adjacent to the fin 104 and the doped fin 106 such that the gate 112 contacts the fin 104 and the doped fin 106. The gate 112 also extends upwards in the semiconductor stack parallel to the fin 104. In block 308, an epitaxial layer 110 is grown or deposited on the doped fin 106. The epitaxial layer 110 may be separated from the dielectric 108 by a spacer 121.

In block 310, a gate contact 116 is formed on the dielectric 108. The gate contact 116 contacts the gate 112 and allows an electrical connection to be made to the gate 112. Additionally, the gate contact 116 is formed above the fin 104 in the semiconductor stack rather than laterally away from the fin 104. In block 312, a fin contact 118 is formed on the epitaxial layer 110 and allows an electrical connection to be made with the fin 104.

In summary, a device 100 may be a VTFET that includes a gate contact 116 that is formed above a fin 104 in the semiconductor stack, rather than laterally away from the fin 104. A doped fin 106 is disposed on the fin 104, and a dielectric 108 is disposed on the doped fin 106. A gate 112 is then formed laterally adjacent to the fin 104, doped fin 106, and the dielectric 108. The gate contact 116 is then disposed on the dielectric 108. As a result, the gate contact 116 is positioned above the fin 104 in the semiconductor stack, which reduces the size of the device 100 relative to conventional VTFETs that form the gate contact laterally from the fin, in certain embodiments The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. An apparatus comprising:
   a fin, wherein a portion of the fin is disposed in a first layer;
   a gate disposed in the first layer and adjacent to the fin; and
   a gate contact electrically connected to and disposed on the gate, wherein the gate contact is in a second layer disposed on the first layer such that the gate contact is above the fin and vertically aligned with the fin.

2. The apparatus of claim 1, further comprising:
   a doped fin adjacent to the gate and disposed on the fin; and
   a dielectric adjacent to the gate and disposed on the doped fin.

3. The apparatus of claim 2, further comprising an epitaxial layer disposed on the doped fin.

4. The apparatus of claim 3, further comprising a fin contact disposed on the epitaxial layer.

5. The apparatus of claim 3, further comprising a spacer between the epitaxial layer and the dielectric.

6. The apparatus of claim 2, wherein a portion of the gate is disposed on the dielectric.

7. The apparatus of claim 1, further comprising:
   a bottom source/drain region adjacent to the fin; and
   a bottom source/drain contact to the bottom source/drain region.

8. The apparatus of claim 1, further comprising:
   a second fin disposed in the first layer;
   a second gate disposed in the first layer and adjacent to the second fin; and
   a second gate contact disposed on the second gate and in the second layer.

9. The apparatus of claim 8, wherein the gate is connected to the second gate.

10. The apparatus of claim 1, further comprising a substrate, wherein the fin is formed from the substrate.

11. A method comprising:
    etching a substrate to form a fin, wherein a portion of the fin is disposed in a first layer;
    forming a gate in the first layer and adjacent to the fin; and
    forming a gate contact on the gate and in a second layer, wherein the second layer is disposed on the first layer such that the gate contact is above the fin and vertically aligned with the fin.

12. The method of claim 11, further comprising:
    forming a doped layer on the substrate; and
    disposing a dielectric on the doped layer before forming the gate.

13. The method of claim 12, further comprising forming an epitaxial layer on the doped layer.

14. The method of claim 13, further comprising forming a fin contact on the epitaxial layer.

15. The method of claim 13, wherein a spacer is positioned between the dielectric and the epitaxial layer.

16. The method of claim 12, wherein a portion of the gate is disposed on the dielectric.

17. The method of claim 11, further comprising:
- forming a bottom source/drain region adjacent to the fin; and
- forming a bottom source/drain contact to the bottom source/drain region.

18. An apparatus comprising:
- a fin;
- a doped fin disposed on the fin;
- a dielectric disposed on the doped fin;
- a gate adjacent to the fin, the doped fin, and the dielectric; and
- a gate contact disposed on the gate and the dielectric such that the gate contact is above the fin and vertically aligned with the fin.

19. The apparatus of claim 18, further comprising:
- an epitaxial layer disposed on the doped fin; and
- a fin contact disposed on the epitaxial layer.

20. The apparatus of claim 19, further comprising a spacer between the epitaxial layer and the dielectric.

* * * * *